US012757689B2

(12) United States Patent
Sasaki

(10) Patent No.: US 12,757,689 B2
(45) Date of Patent: Oct. 6, 2026

(54) METHOD OF MANUFACTURING A VERTICAL SEMICONDUCTOR MEMORY DEVICE USING METAL MASK LAYERS

(71) Applicant: Kioxia Corporation, Tokyo (JP)

(72) Inventor: Toshiyuki Sasaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 709 days.

(21) Appl. No.: 18/177,353

(22) Filed: Mar. 2, 2023

(65) Prior Publication Data

US 2024/0096626 A1 Mar. 21, 2024

(30) Foreign Application Priority Data

Sep. 20, 2022 (JP) ................................ 2022-149518

(51) Int. Cl.
*H10P 76/40* (2026.01)
*H10P 50/00* (2026.01)
*H10P 50/28* (2026.01)

(52) U.S. Cl.
CPC .......... *H10P 76/405* (2026.01); *H10P 50/283* (2026.01); *H10P 50/73* (2026.01)

(58) Field of Classification Search
CPC ...... H10P 76/405; H10P 50/283; H10P 50/73; H10P 14/6336; H10P 14/6939; H10B 43/27
See application file for complete search history.

(56) References Cited

U.S. PATENT DOCUMENTS

| | | | | |
|---|---|---|---|---|
| 2017/0186766 | A1 | 6/2017 | Kitao et al. | |
| 2020/0075341 | A1 | 3/2020 | Matsubara et al. | |
| 2021/0020439 | A1* | 1/2021 | Yamazaki | H10P 50/73 |
| 2021/0066090 | A1 | 3/2021 | Hashimoto et al. | |
| 2021/0074549 | A1* | 3/2021 | Sato | H10P 50/692 |
| 2021/0280431 | A1* | 9/2021 | Kasahara | H10P 50/73 |

FOREIGN PATENT DOCUMENTS

| | | |
|---|---|---|
| JP | 2020-035869 A | 3/2020 |
| JP | 2021-040008 A | 3/2021 |

* cited by examiner

*Primary Examiner* — William B Partridge
*Assistant Examiner* — Chevy J Boegel
(74) *Attorney, Agent, or Firm* — Foley & Lardner LLP

(57) ABSTRACT

A method for manufacturing a semiconductor device includes forming, on a to-be-processed film above an underlying film, a mask material containing a first metal and comprising a first mask layer which is provided on the to-be-processed film and whose content of the first metal is lower than a first predetermined percentage, and a second mask layer which is provided on the first mask layer and whose content of the first metal is equal to or higher than the first predetermined percentage. The manufacturing method includes patterning the mask material. The manufacturing method includes processing the to-be-processed film using the mask material as a mask. The processing of the to-be-processed film includes performing a first treatment to process the to-be-processed film at a first temperature in an atmosphere of a first gas. The processing of the to-be-processed film includes performing a second treatment to process the to-be-processed film at a second temperature higher than the first temperature in an atmosphere of a second gas different from the first gas.

21 Claims, 12 Drawing Sheets

METHOD OF MANUFACTURING A VERTICAL SEMICONDUCTOR MEMORY DEVICE USING METAL MASK LAYERS

CROSS-REFERENCE TO RELATED APPLICATION(S)

This application is based upon and claims the benefit of priority from Japanese Patent Application No. 2022-149518, filed Sep. 20, 2022, the entire contents of which are incorporated herein by reference.

FIELD

Embodiments described herein relate generally to a method for manufacturing a semiconductor device.

BACKGROUND

When a recess, such as a hole or slit, is formed in a film on a substrate by etching, the recess sometimes is not formed well depending on the material of an etching mask layer provided on the film, the etching conditions, etc.

DETAILED DESCRIPTION

Figure 1:
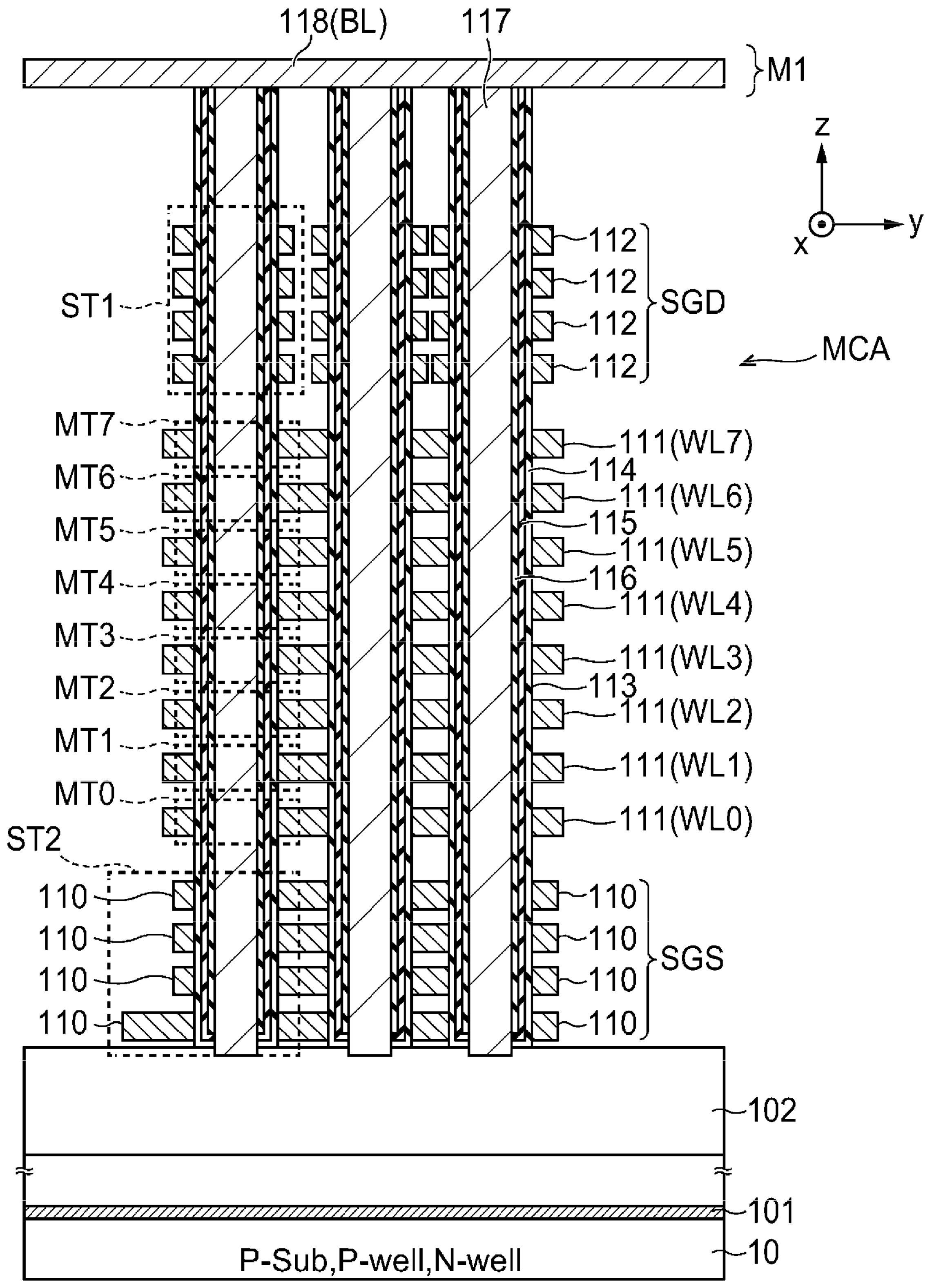
FIG. 1 is a diagram showing an example of the configuration of a memory cell array in a semiconductor device according to a first embodiment.

Embodiments provide a semiconductor device manufacturing method which can form a recess well in a film.

In general, according to at least one embodiment, a method for manufacturing a semiconductor device includes forming, on a to-be-processed film above an underlying film, a mask material containing a first metal and comprising a first mask layer which is provided on the to-be-processed film and whose content of the first metal is lower than a first predetermined percentage, and a second mask layer which is provided on the first mask layer and whose content of the first metal is equal to or higher than the first predetermined percentage. The manufacturing method includes patterning the mask material. The manufacturing method includes processing the to-be-processed film using the mask material as a mask. The processing of the to-be-processed film includes performing a first treatment to process the to-be-processed film at a first temperature in an atmosphere of a first gas. The processing of the to-be-processed film includes performing a second treatment to process the to-be-processed film at a second temperature higher than the first temperature in an atmosphere of a second gas different from the first gas.

Embodiments of the present disclosure will now be described with reference to the drawings. The embodiments do not limit the present disclosure. The drawings are schematic or conceptual; thus, size ratios between components or elements, etc. are not necessarily to scale. In the drawings and the description below, the same symbols are used for the same or similar components or elements as those related to previously described drawings, and a detailed description thereof will sometimes be omitted.

First Embodiment

FIG. 1 is a diagram showing an example of the configuration of a memory cell array in a semiconductor device according to a first embodiment. Insulating portions other than an insulating film formed in a memory hole 113 are omitted in FIG. 1 in order to facilitate understanding of the illustration. Though the following description illustrates the use of silicon as a semiconductor, it is possible to use a semiconductor other than silicon.

An XYZ orthogonal coordinate system is herein employed for the purpose of illustration. In the coordinate system, two mutually perpendicular directions parallel to the main surface of a semiconductor substrate 10 are referred to as X direction and Y direction, and the direction perpendicular to both the X direction and the Y direction is referred to as Z direction. A plurality of word lines WL are stacked in the Z direction. The word lines WL are formed of, for example, a conductive material such as tungsten (W) or molybdenum (Mo).

A control circuit 101 for controlling a memory cell array MCA is provided in a surface region of the semiconductor substrate 10. The control circuit 101 is comprised of, for example, a CMOS circuit. The CMOS circuit may be provided in a p-type well or an n-type well provided in the surface region of the semiconductor substrate 10. The memory cell array MCA including a plurality of memory cells is provided above the control circuit 101.

A plurality of NAND strings NS are formed on a polysilicon layer 102 located above the control circuit 101. In particular, a plurality of interconnect layers 110 that function as select gate lines SGS, a plurality of interconnect layers 111 (word lines WL0 to WL7) that function as word lines WL, and a plurality of interconnect layers 112 that function as select gate lines SGD are formed on the polysilicon layer 102.

The interconnect layers 110 are configured with, for example, four layers and electrically connected to a select gate line SGS common to the NAND strings NS, and function as gate electrodes of two select transistors ST2.

The interconnect layers 111 are configured with, for example, eight layers and are each electrically connected to a common word line WL.

The interconnect layers 112 are configured with, for example, four layers and are each connected to a select gate line SGD corresponding to each NAND string NS, and each function as a gate electrode of one select transistor ST1.

Memory holes 113 each penetrate the interconnect layers 110, 111, 112 and reach the polysilicon layer 102. A block insulating layer 114, a charge storage film 115, and a tunnel insulating film 116 are formed in this order on the side surface of each memory hole 113. Each memory hole 113 is filled with a semiconductor layer 117. The semiconductor layer 117 is, for example, a polysilicon layer. The semiconductor layer 117 functions as a current path for the NAND string NS. An interconnect layer 118 which functions as a bit line BL is formed on the upper end of the semiconductor layer 117. A not-shown core of an insulating material is embedded in the center of the semiconductor layer 117.

As described above, the select transistors ST2, the memory cell transistors MT0 to MT7, and the select transistors ST1 are stacked in this order on the polysilicon layer 102, and one memory hole 113 corresponds to one NAND string NS. The memory cell transistors MT0 to MT7 are provided at positions corresponding to the intersections of each semiconductor layer 117 and the word lines WL0 to WL7.

The components of the same configuration as illustrated in FIG. 1 are arranged in the X direction, constituting the memory cell array MCA having memory cell transistors arranged three-dimensionally.

Figure 2:
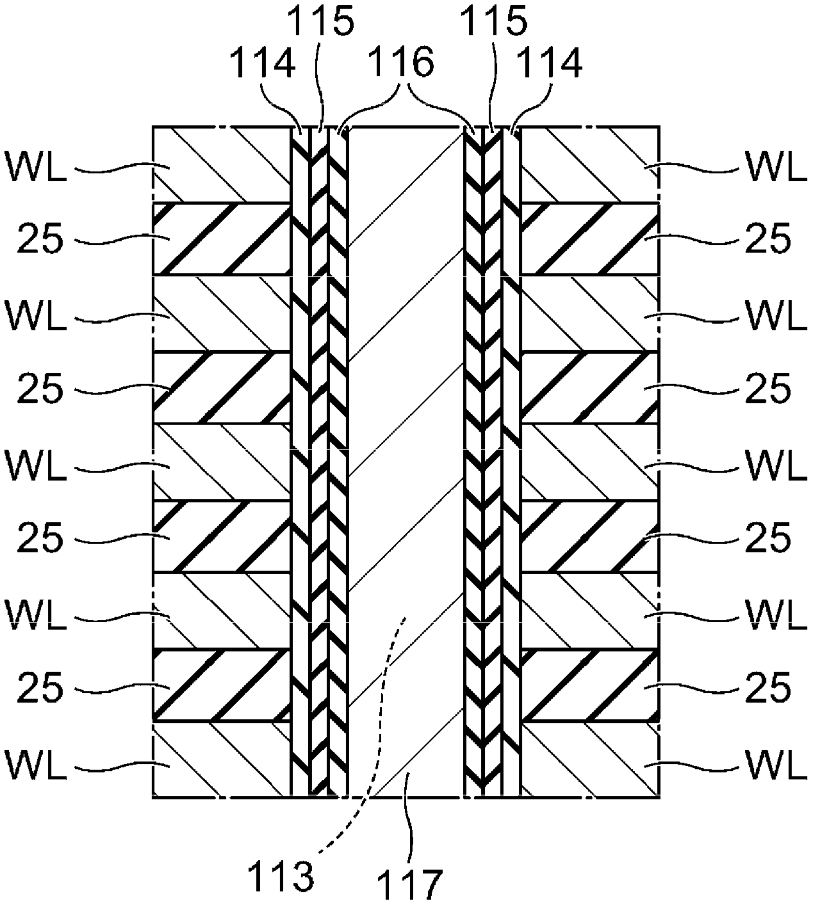
FIG. 2 is an enlarged cross-sectional view of a portion in which a semiconductor layer penetrates word lines and interlayer insulating layers.

FIG. 2 is an enlarged cross-sectional view of a portion in which a semiconductor layer 117 penetrates word lines WL and interlayer insulating layers 25. The insulating layers 25 are each comprised of, for example, a silicon oxide film. The insulating layers 25, shown in FIG. 2, are those insulating layers between the conductive layers WL which are omitted in FIG. 1.

A block insulating layer 114, a charge storage film 115 and a tunnel insulating film 116 are provided in this order, from nearest to farthest from the conductive layers WL, between the semiconductor layer 117 and the conductive layers WL. The block insulating layer 114 is in contact with the conductive layers WL, the tunnel insulating film 116 is in contact with the semiconductor layer 117, and the charge storage film 115 is provided between the block insulating layer 114 and the tunnel insulating film 116.

The semiconductor layer 117 functions as a channel, the conductive layers WL function as control gates, and the charge storage film 115 functions as a data storage layer that stores charges injected from the semiconductor layer 117. Thus, a memory cell having a structure in which a channel is surrounded by a control gate is formed at the intersection of the semiconductor layer 117 and each conductive layer WL.

The semiconductor device according to at least one embodiment is a nonvolatile semiconductor memory device which can freely erase and write data electrically and can retain memory contents even after power is turned off. The memory cell is, for example, a memory cell having a charge trapping structure. The charge storage film 115 has many traps which trap charges (electrons), and is, for example, a silicon nitride film. The tunnel insulating film 116 is, for example, a silicon oxide film, and acts as a potential barrier when charges are injected from the semiconductor layer 117 into the charge storage film 115 or when charges stored in the charge storage film 115 diffuse into the semiconductor layer 117. The block insulating layer 114 is, for example, a silicon oxide film, and prevents charges stored in the charge storage film 115 from diffusing into the conductive layers WL. The semiconductor device may be, for example, a three-dimensional NAND flash memory.

A method for forming the memory holes 113 will now be described.

FIGS. 3 through 9 are cross-sectional diagrams illustrating an example method for manufacturing the semiconductor device according to the first embodiment. The control circuit 101, the polysilicon layer 102, etc. shown in FIG. 1 are omitted in FIGS. 3 through 9.

Figure 3:
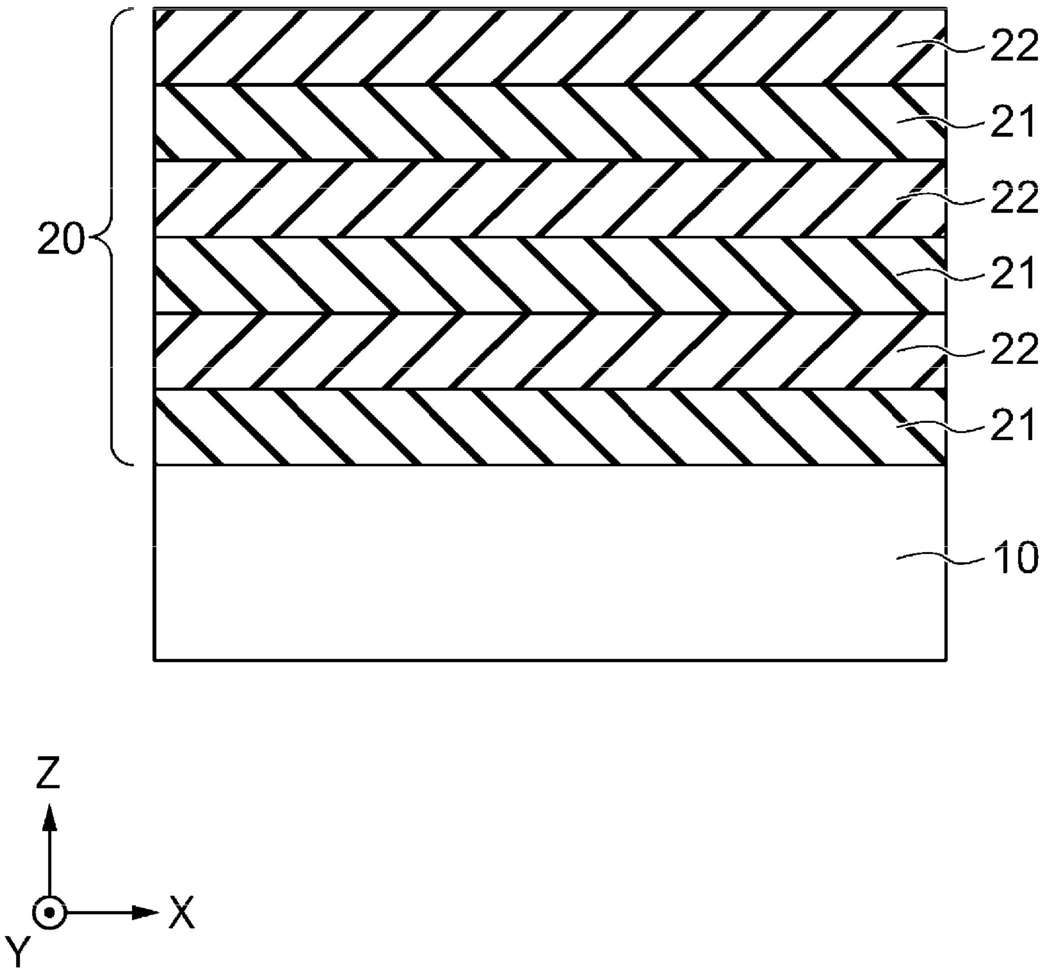
FIG. 3 is a cross-sectional diagram illustrating an example method for manufacturing the semiconductor device according to the first embodiment.

First, as shown in FIG. 3, a multi-layer stack 20 is formed above the semiconductor substrate 10. The semiconductor substrate 10 is, for example, a silicon (Si) substrate. In particular, first films 21 as insulating layers and second films 22 as sacrificial layers are formed alternately in the Z direction using, for example, a CVD (Chemical Vapor Deposition) process or an ALD (Atomic Layer Deposition) process. The first films 21 comprise, for example, silicon oxide, and the second films 22 comprise, for example, silicon nitride. The multi-layer stack 20 is an example of a to-be-processed film.

Figure 4:
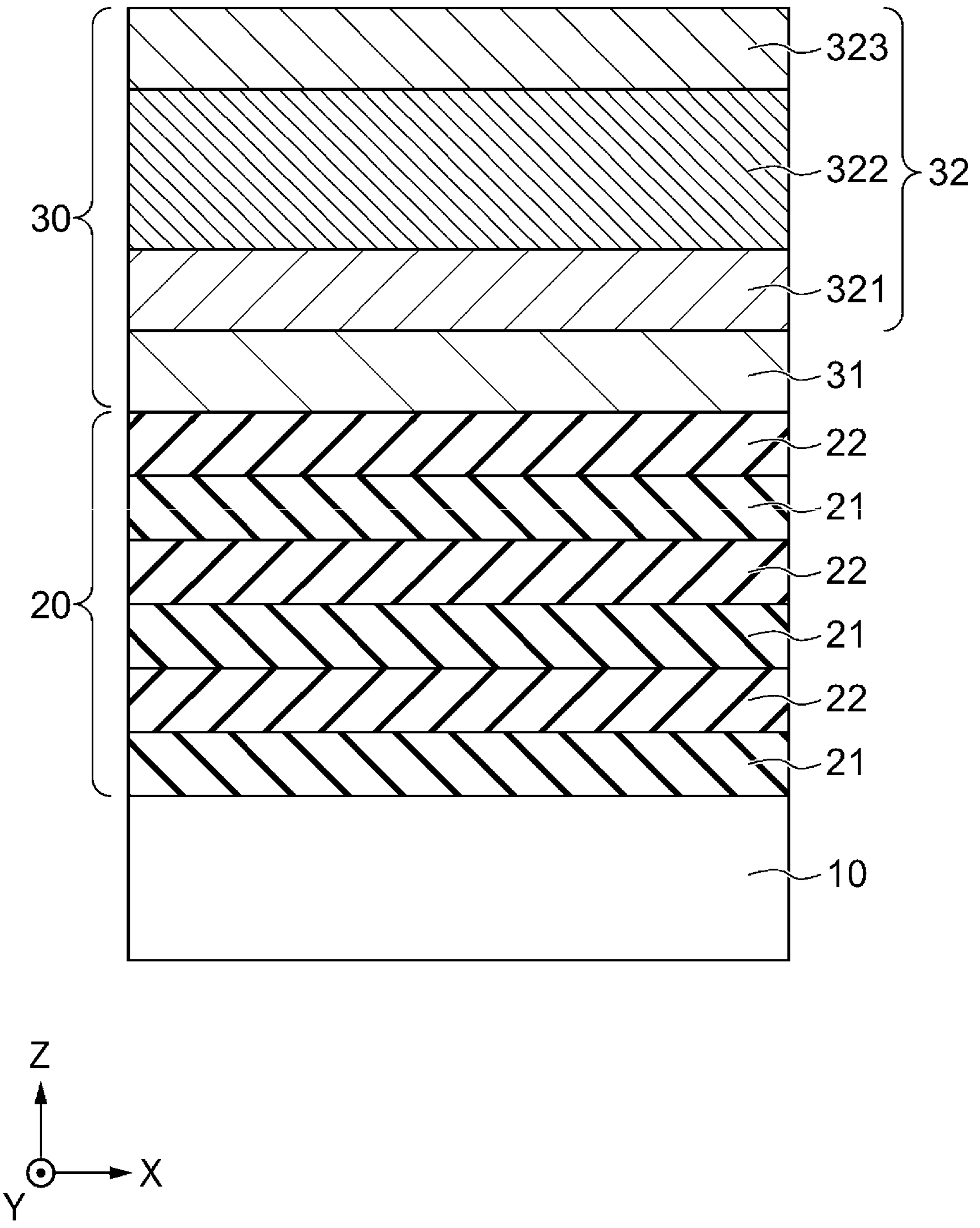
FIG. 4 is a cross-sectional diagram illustrating the example method for manufacturing the semiconductor device, following the step of FIG. 3.

Next, as shown in FIG. 4, a mask material 30 is formed on the uppermost surface of the multi-layer stack 20. The mask material 30 contains a first metal and carbon (C). The following description illustrates a case where the first metal is tungsten (W). The mask material 30 may contain, for example, hydrogen (H) in an amount of about 10% to 20% of the amount of carbon, and oxygen (O) in an amount of about 10% to 20% of the amount of the first metal. In particular, the mask material 30 is formed using, for example, a material gas containing the first metal and halogen, and a reducing gas that reduces the material gas. The material gas contains tungsten and fluorine. The reducing gas contains, for example, hydrogen. A gas comprising tungsten hexafluoride ($WF_6$), for example, may be used as the material gas. It is also possible to use a mixed gas of a tungsten-containing gas and a fluorine-containing gas, as the material gas. A gas comprising propylene ($C_3H_6$), for example, may be used as the reducing gas.

The mask material 30 can be formed, for example, by a plasma CVD process using the above-described material gas. In particular, the material gas and the reducing gas are introduced into a chamber (not shown) in which a plasma has been generated.

The mask material 30 includes mask layers 31, 32. The mask layer 32 includes mask layers 321, 322, 323. The mask layers 31, 321, 322, 323 are distinguished by their different tungsten contents (e.g., atomic %). A tungsten content can be determined, for example, from the results of X-ray fluorescence (XRF) analysis. The mask layer 31 is an example of a first mask layer. The mask layer 32 is an example of a second mask layer. The mask layer 321 is an example of a third mask layer. The mask layer 322 is an example of a fourth mask layer.

The thicknesses of the mask layers 31, 321, 322, 323 and the multi-layer stack 20 in the Z direction are not limited to those illustrated in FIG. 4.

The mask layer 31 is provided on the multi-layer stack 20. The tungsten content in the mask layer 31 is lower than a first predetermined percentage. The first predetermined percentage is, for example, 10%. The thickness of the mask layer 31 is, for example, 1 μm to 1.5 μm.

The mask layer 32 is provided on the mask layer 31. The tungsten content in the mask layer 32 is equal to or higher than the first predetermined percentage.

The mask layer 321 of the mask layer 32 is provided on the mask layer 31. The tungsten content in the mask layer 321 is equal to or lower than a second predetermined percentage. The second predetermined percentage is higher than the first predetermined percentage. The second predetermined percentage is, for example, 50%. The tungsten content in the mask layer 321 is, for example, 30% to 50%. The thickness of the mask layer 321 is, for example, 0.5 μm to 3 μm.

The mask layer 322 of the mask layer 32 is provided on the mask layer 321. The tungsten content in the mask layer 322 is higher than the second predetermined percentage. The tungsten content in the mask layer 322 is, for example, higher than 50%. Thus, the tungsten content in the mask layer 322 is higher than the tungsten content in the mask layer 321. The thickness of the mask layer 322 is, for example, about 1 μm.

The mask layer 323 of the mask layer 32 is provided on the mask layer 322. The tungsten content in the mask layer 323 is, for example, equal to or lower than a third predetermined percentage. The third predetermined percentage is, for example, 50%. The tungsten content in the mask layer 323 is, for example, 30% to 50%. Thus, the tungsten content in the mask layer 323 is lower than the tungsten content in the mask layer 322. The thickness of the mask layer 323 is, for example, less than about 0.5 μm.

The mask layers 31, 321, 322, 323 are formed by changing the gas flow ratio during the formation of the mask material 30. When the tungsten contents are 30%, 40%, 50%, and 70%, the corresponding flow ratios between tungsten hexafluoride ($WF_6$) and propylene ($C_3H_6$) are, for example, 0.4:1, 2.0:1, 3.5:1, and 7.0:1. When the flow rate of propylene ($C_3H_6$) is fixed at 250 sccm, the flow rates of tungsten hexafluoride ($WF_6$) corresponding to the above flow ratios are, for example, 80 sccm to 100 sccm, 450 sccm to 500 sccm, 875 sccm to 1000 sccm, and 1800 sccm to 2000 sccm.

Figure 5:
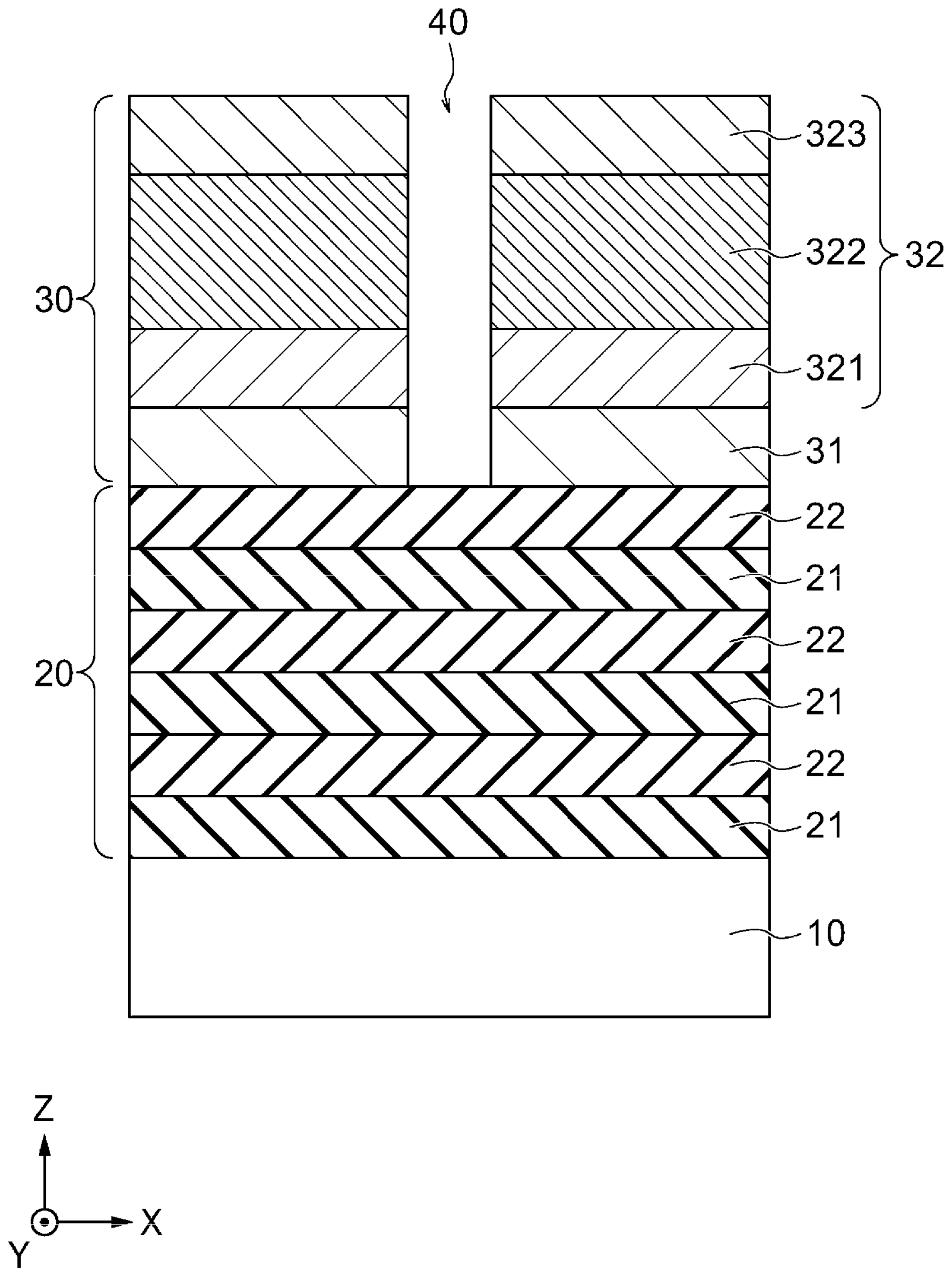
FIG. 5 is a cross-sectional diagram illustrating the example method for manufacturing the semiconductor device, following the step of FIG. 4.

Next, as shown in FIG. 5, recesses 40 penetrating the mask material 30 are formed. As a result, a pattern of the recesses 40 is formed in the mask material 30. The recesses 40 have, for example, a hole-shaped pattern in a plan view. The recesses 40 can be formed, for example, by RIE (Reactive Ion Etching) using a not-shown silicon oxynitride film (SiON film) or the like as a mask. The formation of the recesses 40 is performed in a gas atmosphere containing, for example, oxygen ($O_2$), COS, and $NF_3$.

Figure 6:
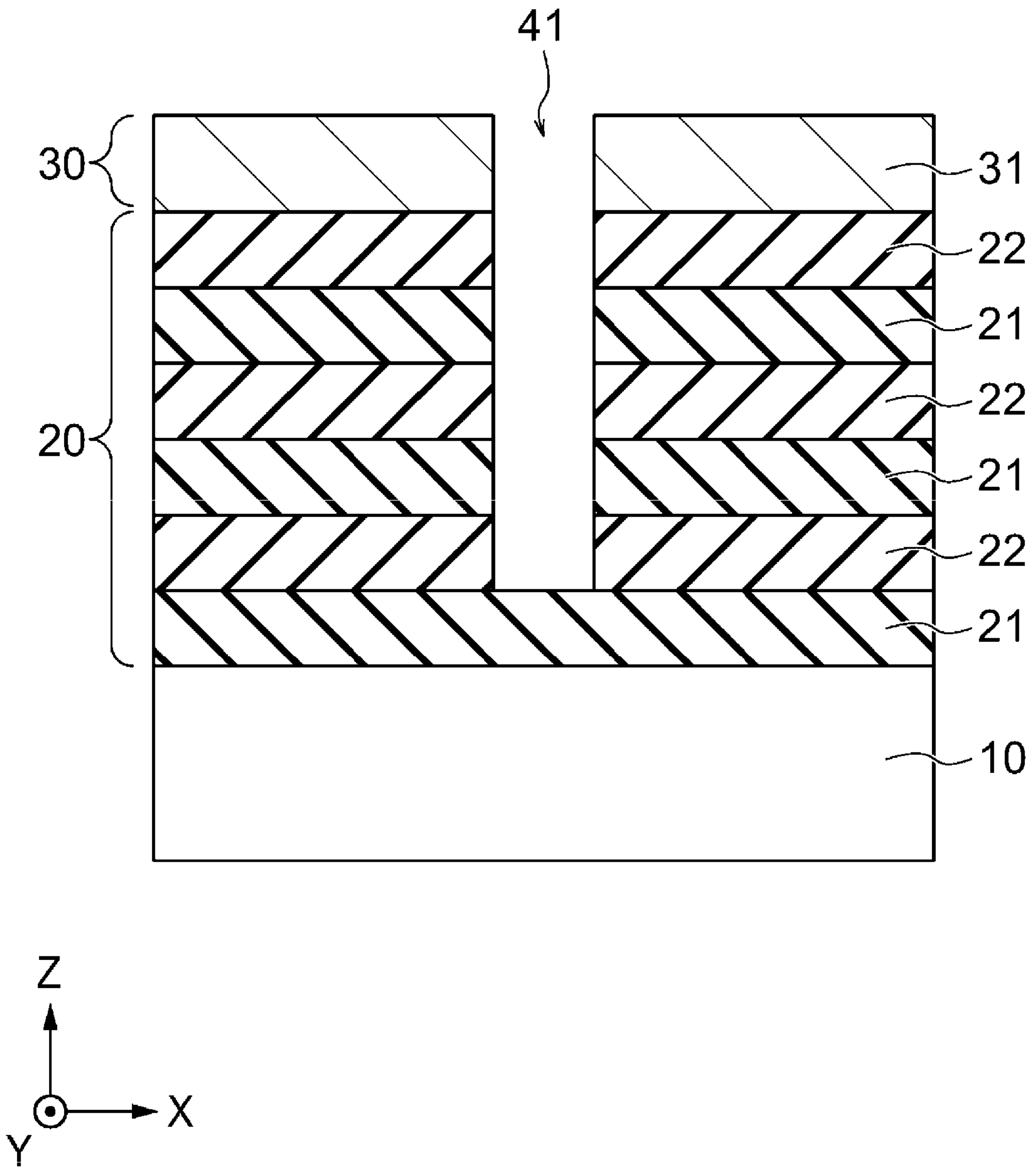
FIG. 6 is a cross-sectional diagram illustrating the example method for manufacturing the semiconductor device, following the step of FIG. 5.

Next, as shown in FIG. 6, the multi-layer stack 20 is processed using the mask material 30 as a mask (first etching). In particular, a pattern of recesses 41 is formed in the multi-layer stack 20 based on the pattern of the recesses 40 in the mask material 30. The recesses 41 are formed at the positions of the recesses 40 in the XY directions. The first etching is performed until the recesses 41 reach a predetermined depth from the upper end of the multi-layer stack 20. For example, the recesses 41 extending in the multi-layer stack 20 may terminate inside the multi-layer stack 20 without reaching the semiconductor substrate 10. The first etching is performed, for example, by RIE.

Figure 7:
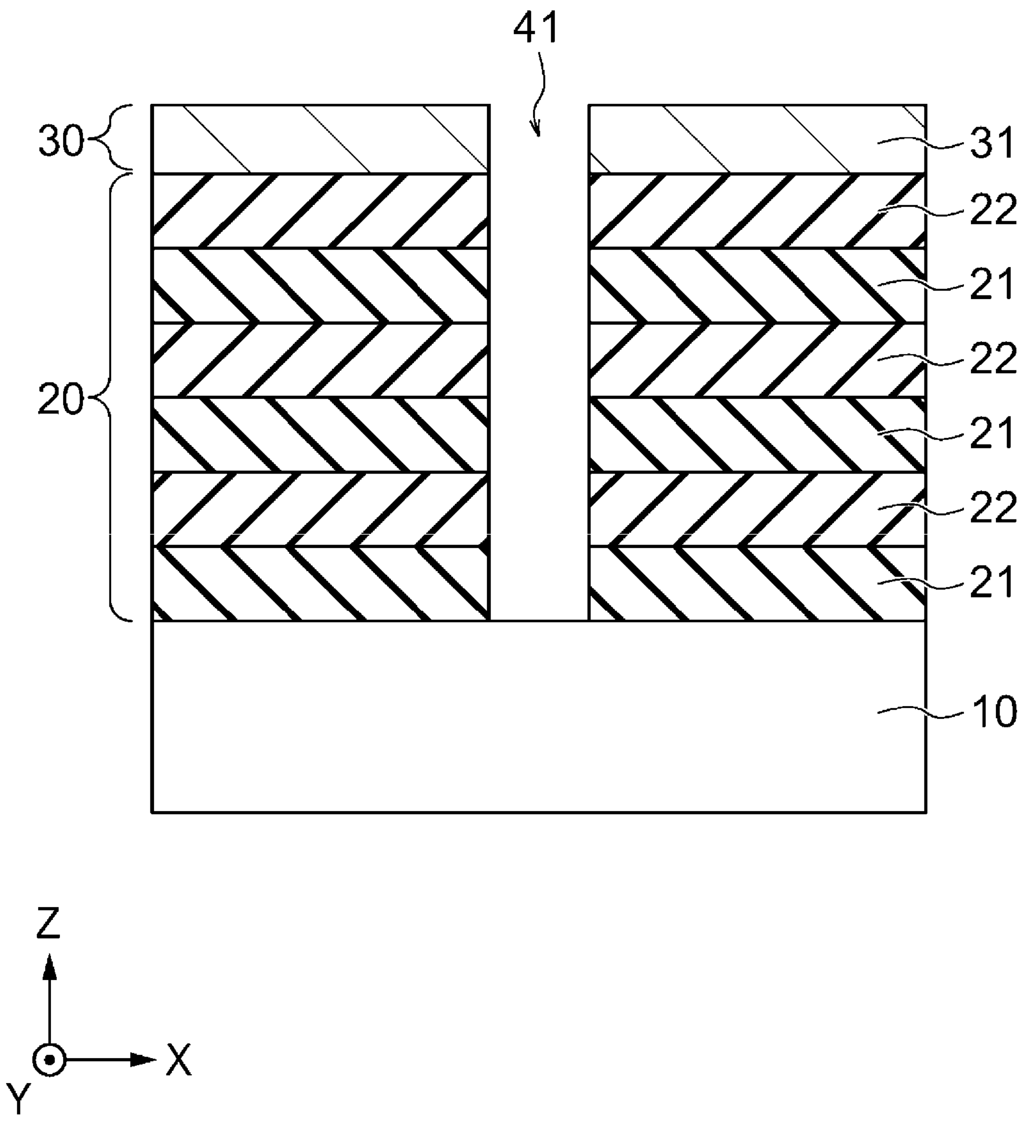
FIG. 7 is a cross-sectional diagram illustrating the example method for manufacturing the semiconductor device, following the step of FIG. 6.

Next, as shown in FIG. 7, the processing of the multi-layer stack 20 is continued under different conditions (second etching), whereby the recesses 41 are formed deeper. The second etching is performed until the recesses 41 reach the lower end of the multi-layer stack 20. The second etching is performed, for example, by RIE.

Details of the first etching and the second etching will be described later.

Figure 8:
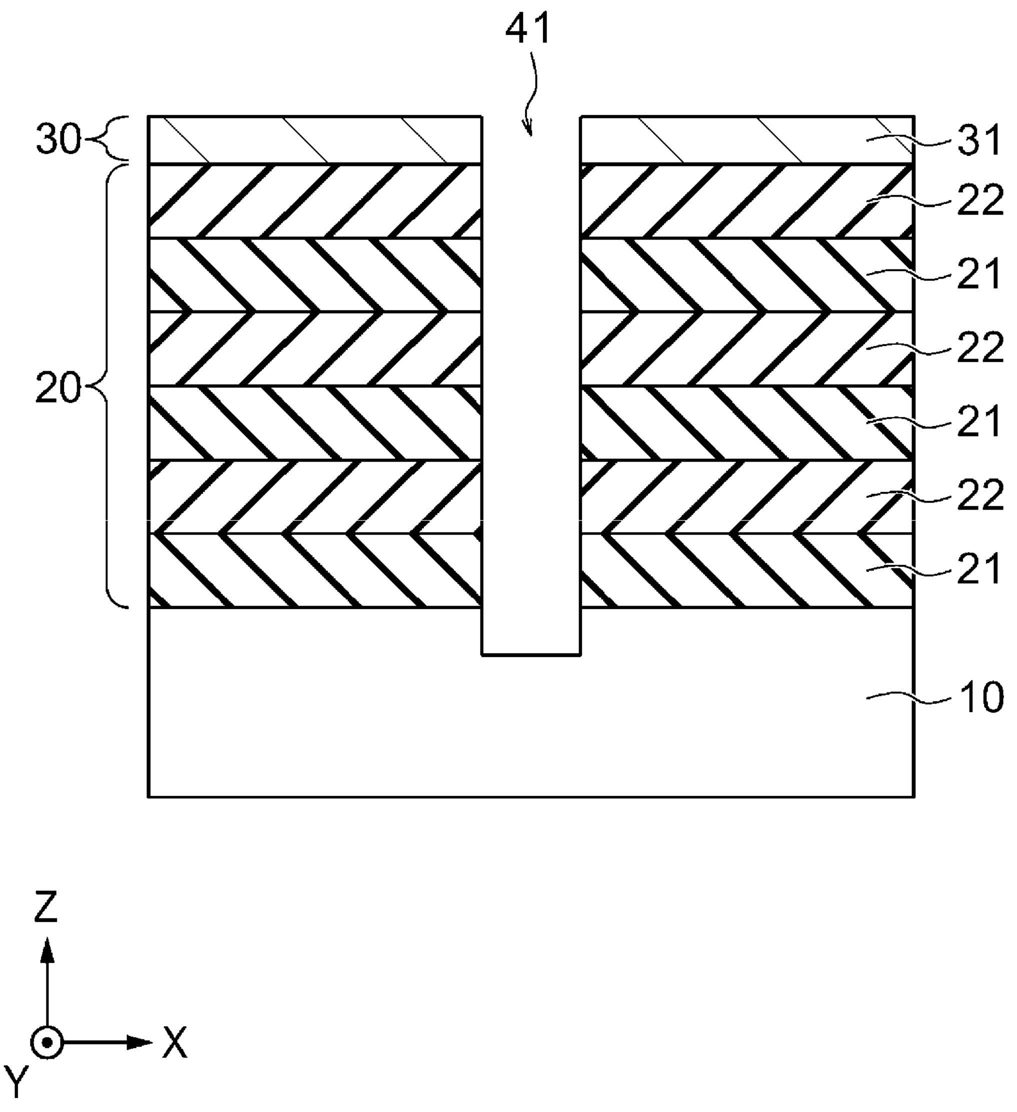
FIG. 8 is a cross-sectional diagram illustrating the example method for manufacturing the semiconductor device, following the step of FIG. 7.

Next, as shown in FIG. 8, overetching is performed under different conditions. As a result, the recesses 41 extend to the semiconductor substrate 10, and the upper end of the semiconductor substrate 10 is partly etched off. The thickness of the mask material 30 remaining after overetching is, for example, about 500 nm to about 700 nm.

Figure 9:
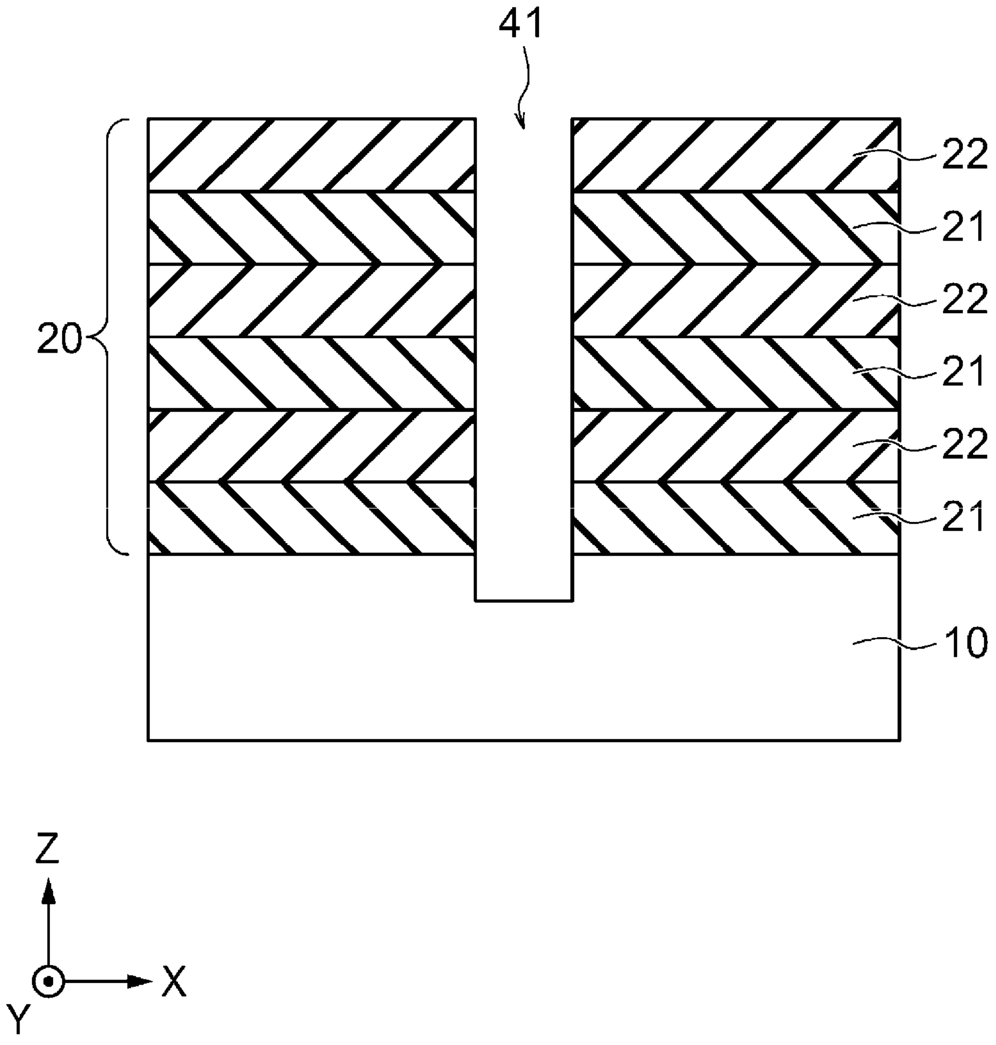
FIG. 9 is a cross-sectional diagram illustrating the example method for manufacturing the semiconductor device, following the step of FIG. 8.

Next, as shown in FIG. 9, the mask material 30 is removed. The mask material 30 can be removed by using a chemical solution. For example, the use of a hydrogen peroxide ($H_2O_2$) solution as the chemical solution can remove the mask material 30 without causing substantial damage to the multi-layer stack 20.

After removing the mask material 30, the memory film shown in FIG. 2, for example, can be formed in the recesses 41 which are memory holes 113. The first films 21 shown in FIG. 9 correspond to the insulating layers 25 shown in FIG. 2. The second films 22 shown in FIG. 9 are replaced with the conductive layers WL shown in FIG. 2 after the formation of the memory film.

Details of the first etching and the second etching will now be described.

As shown in FIG. 6, the first etching (first treatment) for processing the multi-layer stack 20 is performed at a first temperature in an atmosphere of a first gas, using the mask material 30 as a mask. Next, as shown in FIG. 7, the second etching (second treatment) for processing the multi-layer stack 20 is performed at a second temperature in an atmosphere of a second gas, using the mask material 30 as a mask.

The second temperature is a temperature higher than the first temperature. The first temperature is, for example, a temperature of not more than 0° C. The first temperature is, for example, −40 to −10° C. The second temperature is, for example, a temperature of more than 0° C.

The second gas is a gas different from the first gas. The first gas contains hydrogen (H) at a higher concentration than the hydrogen concentration of the second gas. The first gas comprises, for example, $CF_4$ and hydrogen ($H_2$).

The second gas comprises, for example, $CH_2F_2$, $C_4F_6$, and oxygen ($O_2$).

As the number of layers of the multi-layer stack 20 increases, the mask material 30 is required to achieve high selectivity. The mask material 30 containing tungsten has a low etching rate, and therefore achieves high selectivity to a to-be-processed film. However, when etching is performed to form the recesses 41, tungsten in the mask material 30 may enter the recesses 41 and adhere to the side walls of the recesses 41. Since tungsten has a high etching resistance, the tungsten adhering to the side walls of the recesses 41 function as a micromask and retard the progress of etching. When a CF (fluorocarbon) gas is used for etching, a CF film may be deposited on the side walls of the recesses 41. Thus, both an area which is relatively difficult to etch due to the adhesion of tungsten and an area which is relatively easy to etch due to the deposition of the CF film are present in the side wall of each recess 41.

Because of the presence of the above-described two areas during etching, the circularity of the recesses 41 may be reduced and, in addition, vertical streak-like roughening, called striation, is likely to occur on the side walls of the recesses 41. In other words, there is a possibility of the occurrence of a shape abnormality of the recesses 41. The higher the tungsten concentration of the mask material 30, i.e., the higher the selectivity, the more the circularity reduction and striation are likely to occur.

A deposited film is less likely to be formed under the conditions of the first etching, which differ in the temperature, the type of the gas used, etc. from the second etching conditions. Therefore, a shape abnormality of the recesses 41 is less likely to occur in the first etching than in the second etching. Thus, by performing the first etching using the mask material 30 containing a high concentration of tungsten, the multi-layer stack 20 can be processed with the high-selectivity mask material 30 while preventing the occurrence of a shape abnormality of the recesses 41. This makes it possible to form the recesses 41 with a high aspect ratio while preventing a shape abnormality of the recesses 41.

However, the selectivity ratio of the multi-layer stack 20 to the silicon of the semiconductor substrate 10 is low under the conditions of the first etching. In such a case, the recesses 41 that completely penetrate the multi-layer stack 20 are likely to be formed deep in the semiconductor substrate 10.

Therefore, before the recesses 41 reach the semiconductor substrate 10, the etching conditions need to be switched to conditions in which the selectivity ratio of the multi-layer stack 20 to the silicon of the semiconductor substrate 10 is high. Thus, the selectivity ratio of the multi-layer stack 20 to the semiconductor substrate 10 in the second etching is higher than the selectivity ratio of the multi-layer stack 20 to the semiconductor substrate 10 in the first etching. As described above, a deposited film is more likely to be produced under the conditions of the second etching than under the conditions of the first etching. In order to prevent a shape abnormality of the recesses 41, the tungsten concentration of the mask material 30 needs to be low during the second etching. By performing the first etching and the second etching in the above-described manner, the recesses 41 can be formed well in the multi-layer stack 20.

As shown in FIG. 6, the first etching is performed using the mask layer 32 having a relatively high tungsten content as a mask. As shown in FIG. 7, the second etching is performed using the mask layer 31 having a relatively low tungsten content as a mask. However, the timing of switching from the first etching to the second etching does not necessarily correspond to the boundary between the mask layer 31 and the mask layer 32. The timing of switching from the first etching to the second etching is set, for example, at the time when the lower ends of the recesses 41 reach a position at a predetermined distance (e.g., 500 nm) from the upper end of the semiconductor substrate 10.

As described above, the control circuit 101, the polysilicon layer 102, etc. shown in FIG. 1 are omitted in FIGS. 3 through 9. Thus, instead of the semiconductor substrate 10, a silicon-containing layer, e.g. the polysilicon layer 102, may be provided under the multi-layer stack 20. In that case, the second etching is performed until the recesses 41 reach the polysilicon layer 102.

As described above, according to the first embodiment, the mask material 30 includes the mask layer 31 provided on the multi-layer stack 20 and having a tungsten content lower than a first predetermined percentage, and the mask layer 32 provided on the mask layer 31 and having a tungsten content equal to or higher than the first predetermined percentage. The processing of the multi-layer stack 20 includes performing the first etching to process the multi-layer stack 20 at a first temperature in an atmosphere of a first gas. The processing of the multi-layer stack 20 includes performing, after the first etching, the second etching to process the multi-layer stack 20 at a second temperature in an atmosphere of a second gas. Such an etching process can form the recesses 41 well in the multi-layer stack 20.

The first metal is not limited to tungsten. The first metal may be, for example, molybdenum (Mo) or the like, which has chemical properties similar to those of tungsten. When the first metal is Mo, the material gas may be, for example, a gas containing $MoF_6$.

The second gas may be a gas which facilitates the deposition of a CF film as compared to the first gas.

The phenomenon of diameter enlargement in the recesses 40 in the mask material 30, called bowing, will now be described.

Figure 10:
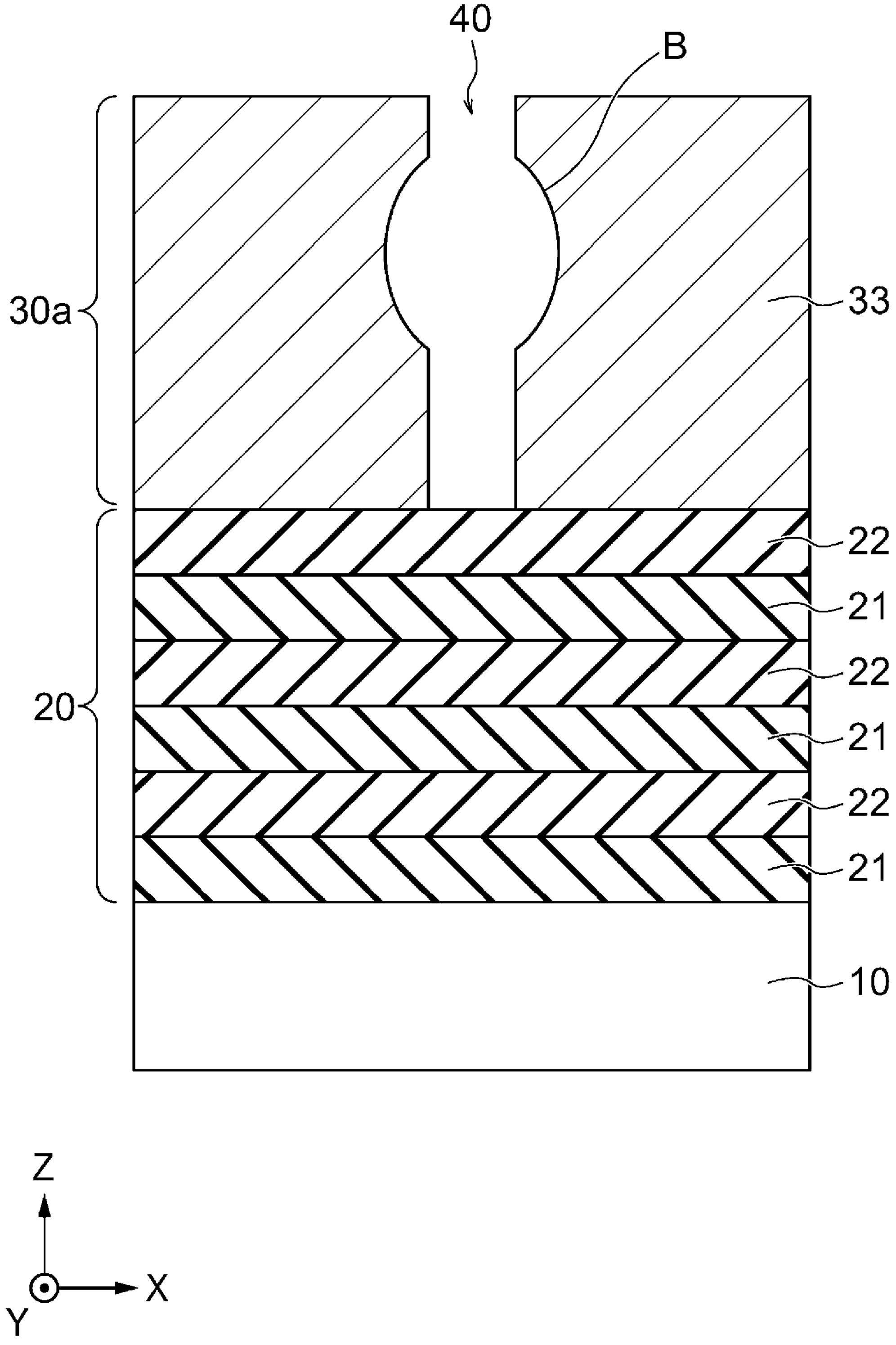
FIG. 10 is a cross-sectional diagram illustrating a comparative method for manufacturing a semiconductor device.

During the formation of the recesses 40 as illustrated in FIG. 5, a bowed portion is sometimes formed in a recess 40 because of, for example, recoil of ions upon RIE or collision of ions with a neck (see FIG. 10). The neck is a portion where the inner diameter of a hole, such as a recess 40, is locally reduced.

In view of this, the mask layer 322 having a relatively high tungsten content is formed e.g. at a position where bowing is likely to occur. By thus preventing the occurrence of bowing in the recesses 40, the recesses 41 can be formed well in the multi-layer stack 20. The mask layers 321, 323 having a lower tungsten content than the mask layer 322 are provided at positions where bowing does not occur. This can facilitate processing of the mask layer 32 while preventing bowing.

COMPARATIVE EXAMPLE

FIG. 10 is a cross-sectional diagram illustrating a comparative method for manufacturing a semiconductor device.

A mask material 30*a* comprises a mask layer 33. The mask layer 33 is formed by, for example, CVD. The mask layer 33 contains carbon. The mask layer 33 contains substantially no tungsten. Therefore, the etching rate of the mask material 30*a* according to the comparative method is higher than the etching rate of the mask material 30 containing tungsten described above with reference to the first embodiment. Thus, the selectivity of the mask material 30*a* according to the comparative method is lower than that of the mask material 30 according to the first embodiment.

As shown in FIG. 10, a bowed portion B is likely to be formed in the recess 40 in the comparative method.

In contrast, in the first embodiment, the mask material 30 contains tungsten. This enables prevention of bowing. Further, the mask layer 32 includes the mask layer 322 having a high tungsten content disposed at a position where bowing is likely to occur. This enables further prevention of bowing.

Second Embodiment

Figure 11:
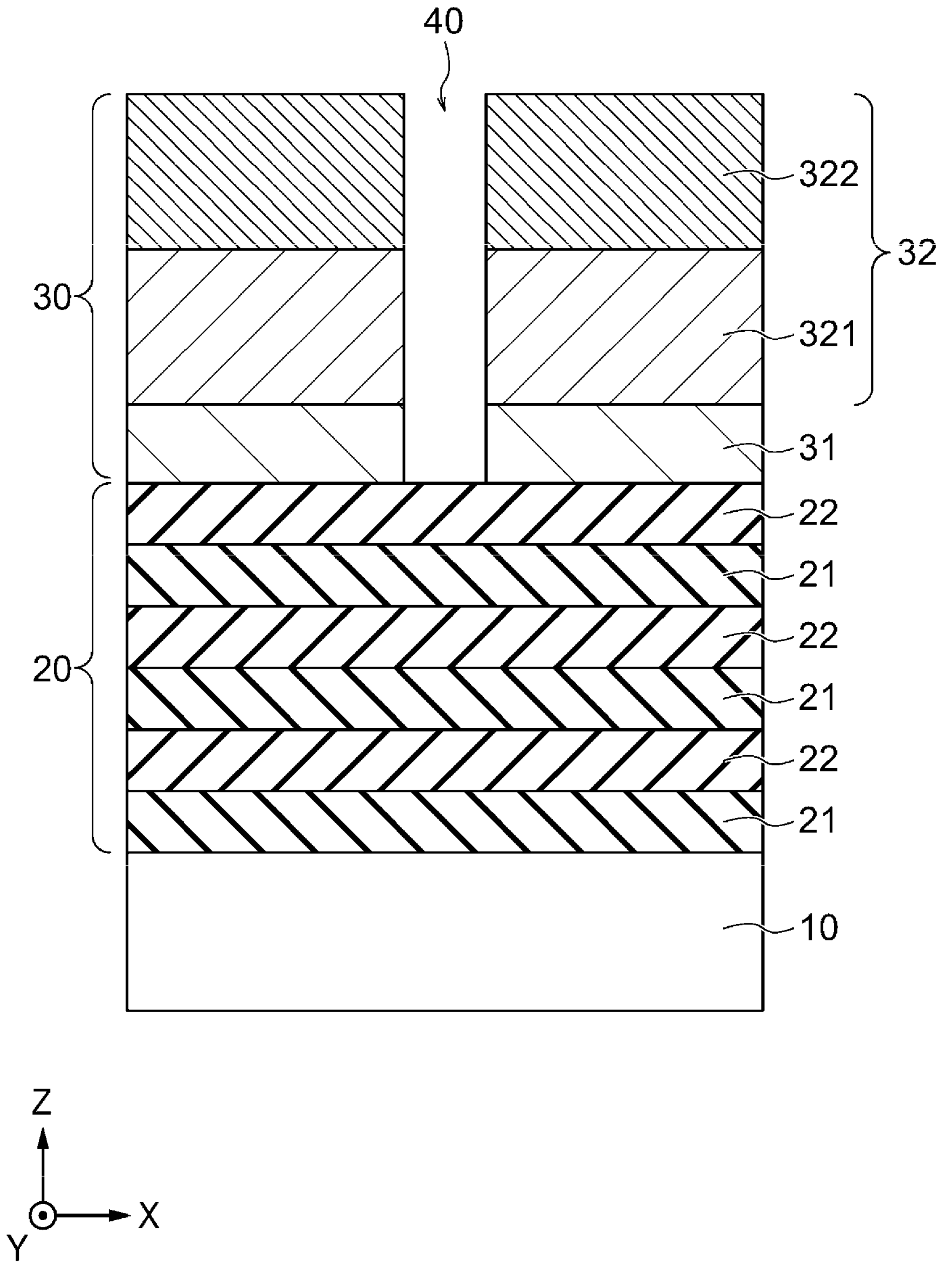
FIG. 11 is a cross-sectional diagram illustrating an example method for manufacturing a semiconductor device according to a second embodiment.

FIG. 11 is a cross-sectional diagram illustrating an example method for manufacturing a semiconductor device according to a second embodiment. The second embodiment differs from the first embodiment in the configuration of the mask layer 32.

The mask layer 32 includes the mask layers 321, 322. The mask material 30 thus includes the three mask layers 31, 321, 322. The mask layer 323, provided in the first embodiment, is not provided in the second embodiment.

The thickness of the mask layer 321 is, for example, 0.5 μm to 3 μm. The thickness of the mask layer 322 is, for example, about 1 μm.

As shown in FIG. 11, the position of the mask layer 322 is changed according to a position where bowing is likely to occur.

The configuration of the mask layer 32 may be modified as in the second embodiment. The method for manufacturing a semiconductor device according to the second embodiment can achieve the same effects as those of the first embodiment.

Third Embodiment

Figure 12:
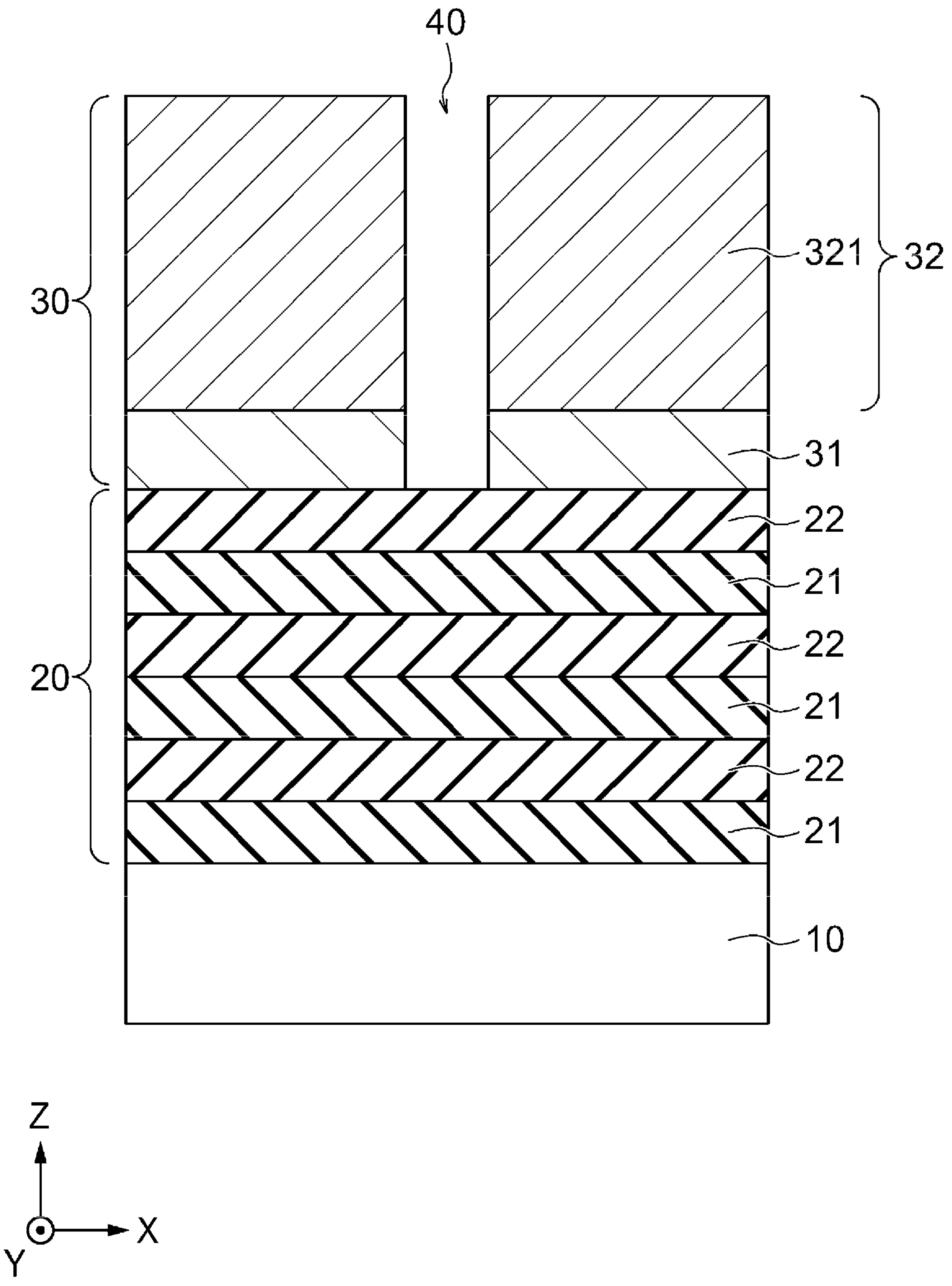
FIG. 12 is a cross-sectional diagram illustrating an example method for manufacturing a semiconductor device according to a third embodiment.

FIG. 12 is a cross-sectional diagram illustrating an example method for manufacturing a semiconductor device according to a third embodiment. The third embodiment differs from the first embodiment in the configuration of the mask layer 32.

The mask layer 32 includes the mask layer 321. The mask material 30 thus includes the two mask layers 31, 321. The mask layers 322, 323, provided in the first embodiment, are not provided in the third embodiment.

The thickness of the mask layer 321 is, for example, 0.5 μm to 4 μm.

The configuration of the mask layer 32 may be modified as in the third embodiment. The method for manufacturing a semiconductor device according to the third embodiment can achieve the same effects as those of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:

forming a mask material on a to-be-processed film above an underlying film, the mask material containing a first metal and comprising a first mask layer and a second mask layer, the first mask layer is disposed on the to-be-processed film, the first mask layer having a content of the first metal lower than a first predetermined percentage, the second mask layer disposed on the first mask layer, the second mask layer having a content of the first metal equal to or higher than the first predetermined percentage;

patterning the mask material; and processing the to-be-processed film using the mask material as a mask, wherein the processing the to-be-processed film comprises performing a first treatment to process the to-be-processed film at a first temperature in an atmosphere of a first gas, and performing a second treatment to process the to-be-processed film at a second temperature higher than the first temperature in an atmosphere of a second gas different from the first gas;

wherein a thickness of the first mask layer is 1 μm to 1.5 μm.

2. The method for manufacturing a semiconductor device according to claim 1, further comprising performing the first treatment until a recess reaches a predetermined depth from an upper end of the to-be-processed film, and performing the second treatment until the recess reaches a lower end of the to-be-processed film.

3. The method for manufacturing a semiconductor device according to claim 1, further comprising performing the first treatment using the second mask layer as a mask, and performing the second treatment using the first mask layer as a mask.

4. The method for manufacturing a semiconductor device according to claim 1, wherein the first predetermined percentage is 10%.

5. The method for manufacturing a semiconductor device according to claim 1, wherein the second mask layer comprises a third mask layer and a fourth mask layer, the third mask layer disposed on the first mask layer, the third mask layer having a content of the first metal equal to or lower than a second predetermined percentage, the fourth mask layer disposed on the third mask layer and having content of the first metal higher than the second predetermined percentage, and wherein the second predetermined percentage is higher than the first predetermined percentage.

6. The method for manufacturing a semiconductor device according to claim 5, wherein the first predetermined percentage is 10%, and the second predetermined percentage is 50%.

7. The method for manufacturing a semiconductor device according to claim 1, wherein the first temperature is not more than 0° C., and the second temperature is more than 0° C.

8. The method for manufacturing a semiconductor device according to claim 1, wherein the first gas contains hydrogen ($H_2$) at a higher concentration than the hydrogen concentration of the second gas.

9. The method for manufacturing a semiconductor device according to claim 1, wherein the first metal is tungsten (W) or molybdenum (Mo).

10. The method for manufacturing a semiconductor device according to claim 1, wherein the mask material further contains carbon (C).

11. The method for manufacturing a semiconductor device according to claim 1, wherein the selectivity ratio of the to-be-processed film to the underlying film in the second treatment is higher than the selectivity ratio of the to-be-processed film to the underlying film in the first treatment.

12. The method for manufacturing a semiconductor device according to claim 1, wherein the underlying film comprises silicon (Si).

13. The method for manufacturing a semiconductor device according to claim 1, wherein the mask material is formed using a material gas containing the first metal and halogen, and a reducing gas.

14. The method for manufacturing a semiconductor device according to claim 13, wherein the material gas contains tungsten and fluorine, and the reducing gas contains hydrogen.

15. The method for manufacturing a semiconductor device according to claim 1, further comprising removing the mask material.

16. The method for manufacturing a semiconductor device according to claim 1, wherein the mask material includes hydrogen, carbon and oxygen.

17. The method for manufacturing a semiconductor device according to claim 16, wherein an amount of hydrogen is 10% to 20% of an amount of oxygen and carbon.

18. The method for manufacturing a semiconductor device according to claim 1, wherein the to-be-processed film includes a multi-layer stack.

19. The method for manufacturing a semiconductor device according to claim 2, further comprising forming a memory film in the recess.

20. A method for manufacturing a semiconductor device, comprising:

forming a mask material on a to-be-processed film above an underlying film, the mask material containing a first metal and comprising a first mask layer and a second mask layer, the first mask layer is disposed on the to-be-processed film, the first mask layer having a content of the first metal lower than a first predetermined percentage, the second mask layer disposed on the first mask layer, the second mask layer having a content of the first metal equal to or higher than the first predetermined percentage;

patterning the mask material; and processing the to-be-processed film using the mask material as a mask, wherein the processing the to-be-processed film comprises performing a first treatment to process the to-be-processed film at a first temperature in an atmosphere of a first gas, and performing a second treatment to process the to-be-processed film at a second temperature higher than the first temperature in an atmosphere of a second gas different from the first gas, and the first temperature is not more than 0° C., and the second temperature is more than 0° C.

21. A method for manufacturing a semiconductor device, comprising:

forming a mask material on a to-be-processed film above an underlying film, the mask material containing a first metal and comprising a first mask layer and a second mask layer, the first mask layer is disposed on the to-be-processed film, the first mask layer having a content of the first metal lower than a first predetermined percentage, the second mask layer disposed on the first mask layer, the second mask layer having a content of the first metal equal to or higher than the first predetermined percentage;

patterning the mask material; and processing the to-be-processed film using the mask material as a mask, wherein the processing the to-be-processed film comprises performing a first treatment to process the to-be-processed film at a first temperature in an atmosphere of a first gas, and performing a second treatment to process the to-be-processed film at a second temperature higher than the first temperature in an atmosphere of a second gas different from the first gas, and the first gas contains hydrogen ($H_2$) at a higher concentration than the hydrogen concentration of the second gas.

* * * * *